(12) United States Patent
Isobe

(10) Patent No.: US 11,513,171 B2
(45) Date of Patent: Nov. 29, 2022

(54) MAGNETIC SENSOR DEVICE INCLUDING A PLURALITY OF ASYMMETRICALLY ARRANGED ELEMENTS

(71) Applicant: KABUSHIKI KAISHA TOKAI RIKA DENKI SEISAKUSHO, Aichi (JP)

(72) Inventor: Naoki Isobe, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 9 days.

(21) Appl. No.: 17/040,668

(22) PCT Filed: May 14, 2019

(86) PCT No.: PCT/JP2019/019157
§ 371 (c)(1),
(2) Date: Sep. 23, 2020

(87) PCT Pub. No.: WO2019/221132
PCT Pub. Date: Nov. 21, 2019

(65) Prior Publication Data
US 2021/0156932 A1 May 27, 2021

(30) Foreign Application Priority Data
May 18, 2018 (JP) .............................. JP2018-095927

(51) Int. Cl.
*G01R 33/09* (2006.01)
*G01D 5/16* (2006.01)
(Continued)

(52) U.S. Cl.
CPC .............. *G01R 33/09* (2013.01); *G01D 5/16* (2013.01); *G01R 33/038* (2013.01); *H03K 17/95* (2013.01); *H03K 17/97* (2013.01)

(58) Field of Classification Search
CPC ...... H03K 17/94; H03K 17/945; H03K 17/95; H03K 17/9505; H03K 17/97; G01D 5/14;
(Continued)

(56) References Cited

U.S. PATENT DOCUMENTS

| 6,509,732 B1 * | 1/2003 | Rhodes | G01B 7/003 |
| | | | 324/207.12 |
| 6,949,927 B2 * | 9/2005 | Goetz | G01R 33/096 |
| | | | 324/252 |

(Continued)

FOREIGN PATENT DOCUMENTS

| EP | 2 760 040 A1 | 7/2014 |
| JP | 2015-507871 A | 3/2015 |

OTHER PUBLICATIONS

International Search Report, dated Aug. 6, 2019 by the Japan Patent Office (JPO), in International Application No. PCT/JP2019/019157.

*Primary Examiner* — Huy Q Phan
*Assistant Examiner* — David B Frederiksen
(74) *Attorney, Agent, or Firm* — Greenblum & Bernstein, P.L.C.

(57) ABSTRACT

A magnetic sensor device includes a switching region defined by a switching range and a variation range, the switching range being set in a stroke direction of a magnet generating a radial magnetic field and defined by a start position and an end position for switching of the state, and the variation range being set in a direction intersecting the stroke direction and being a range of variation in the position of the magnet, and a magnetic sensor including plural first divided elements that are formed by dividing a first circular magneto-resistive element and are consecutively rotated and rearranged around the switching region such that change in a magnetoresistance value due to the magnetic field of the magnet in the switching region increases from the start position to the end position.

9 Claims, 7 Drawing Sheets

(51) Int. Cl.
*G01R 33/038* (2006.01)
*H03K 17/95* (2006.01)
*H03K 17/97* (2006.01)

(58) Field of Classification Search
CPC .... G01D 5/16; G01R 33/0005; G01R 33/038; G01R 33/06; G01R 33/09–098; H01H 13/00
See application file for complete search history.

(56) References Cited

U.S. PATENT DOCUMENTS

| | | | | |
|---|---|---|---|---|
| 7,030,604 | B1* | 4/2006 | Dmytriw | G01D 3/032 |
| | | | | 324/207.12 |
| 7,812,596 | B2* | 10/2010 | Potter | G06F 3/0338 |
| | | | | 324/207.21 |
| 8,018,223 | B2* | 9/2011 | Latoria | G01R 33/09 |
| | | | | 324/252 |
| 9,046,383 | B2* | 6/2015 | Friedrich | F16H 59/044 |
| 2013/0278247 | A1* | 10/2013 | Kunjappan | G01R 33/07 |
| | | | | 324/207.2 |
| 2015/0338293 | A1* | 11/2015 | Masunishi | A61B 5/021 |
| | | | | 73/649 |
| 2018/0087889 | A1* | 3/2018 | Ausserlechner | G01D 5/147 |
| 2019/0195969 | A1* | 6/2019 | Watanabe | G01R 33/098 |
| 2019/0339340 | A1* | 11/2019 | Hainz | G01R 33/093 |

* cited by examiner

MAGNETIC SENSOR DEVICE INCLUDING A PLURALITY OF ASYMMETRICALLY ARRANGED ELEMENTS

CROSS-REFERENCES TO RELATED APPLICATIONS

The present patent application claims the priority of Japanese patent application No. 2018/095927 filed on May 18, 2018, and the entire contents of Japanese patent application No. 2018/095927 are hereby incorporated by reference.

TECHNICAL FIELD

The present invention relates to a magnetic sensor device.

BACKGROUND ART

A non-contact switch is known which is provided with a button arranged at a predetermined position on the housing, operated by external pressure and having a magnetic body at one end, and a magnetic field sensor element housed in the housing, facing the magnetic body and generating an induced voltage corresponding to a distance from the magnetic body (see, e.g., Patent Literature 1).

The non-contact switch providing a contactless structure by using the magnetic field sensor element etc. is different from existing switches adapting a contact-type structure such that it can have improved durability as compared to the existing switches and also can eliminate noise which could be generated at the time of operation of the switch. A magneto-resistive element etc. is used as the magnetic field sensor element.

CITATION LIST

Patent Literature

Patent Literature 1: JP 2015-507871 A

SUMMARY OF INVENTION

Technical Problem

MR (Magneto Resistive) sensor with a circular magneto-resistive element is known as the magnetic field sensor element. When a magnet generating a radial magnetic field is located at the center thereof, an angle formed between the magnetic field and the magneto-resistive element becomes a right angle. Therefore, the magnetoresistance value becomes smaller than when the magnet is located outside, and switching of the state such as ON and OFF can be detected. In case of the MR sensor, however, when considering that the position of the magnet varies, it is necessary to increase the size of the circular magneto-resistive element to maintain accurate state switching.

It is an object of the invention to provide a magnetic sensor device which can be reduced in size while having an endurance to a disturbance magnetic field.

Solution to Problem

According to an embodiment of the invention, a magnetic sensor device comprises: a switching region defined by a switching range and a variation range, the switching range being set in a stroke direction of a magnet generating a radial magnetic field and defined by a start position and an end position for switching of the state, and the variation range being set in a direction intersecting the stroke direction and being a range of variation in the position of the magnet; and a magnetic sensor comprising a plurality of first divided elements that are formed by dividing a first circular magneto-resistive element and are consecutively rotated and rearranged around the switching region such that change in a magnetoresistance value due to the magnetic field of the magnet in the switching region increases from the start position to the end position.

Advantageous Effects of Invention

According to an embodiment of the invention, it is possible to provide a magnetic sensor device which can be reduced in size while having an endurance to a disturbance magnetic field.

DESCRIPTION OF EMBODIMENTS

Summary of the Embodiments

A magnetic sensor device in the embodiments has a switching region defined by a switching range and a variation range, the switching range being set in a stroke direction of a magnet generating a radial magnetic field and defined by a start position and an end position for switching of the state, and the variation range being set in a direction intersecting the stroke direction and being a range of variation in the position of the magnet, and a magnetic sensor comprising a plurality of first divided elements that are formed by dividing a first circular magneto-resistive element and are consecutively rotated and rearranged around the switching region such that change in a magnetoresistance value due to the magnetic field of the magnet in the switching region increases from the start position to the end position.

The magnetic sensor device in the embodiments provides high switching accuracy while being small in size even after division and rearrangement since the amount of change in the magnetoresistance value is large. In addition, since the circular magneto-resistive element is divided and rearranged, the magnetic sensor device has a high endurance to a disturbance magnetic field. Therefore, as compared to when not dividing, the magnetic sensor device can be reduced in size while having an endurance to a disturbance magnetic field.

First Embodiment (General Configuration of Magnetic Sensor Device 1)

Figure 1A:
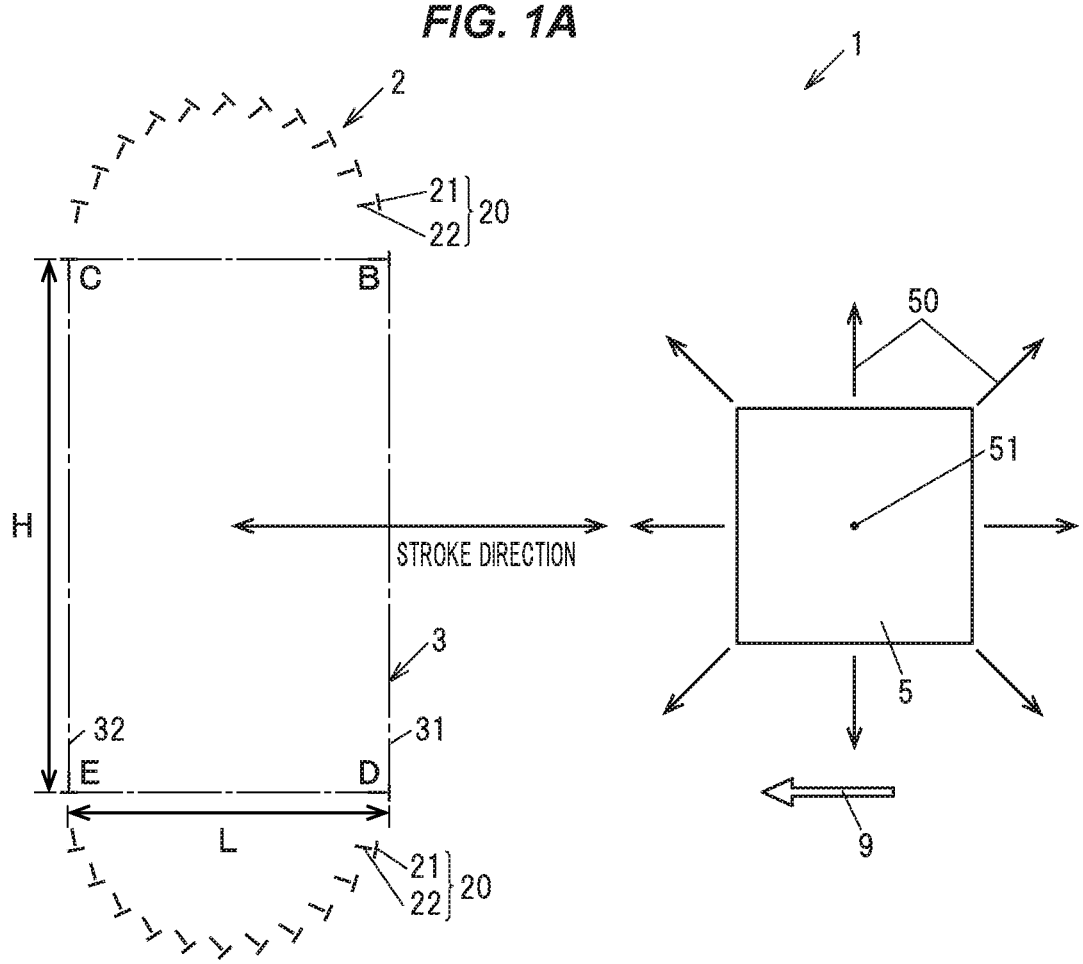
FIG. 1A is an explanatory diagram illustrating a magnetic sensor device in the first embodiment.
Figure 1B:
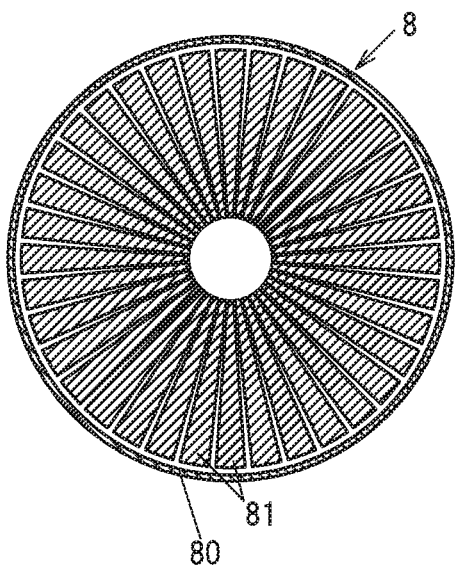
FIG. 1B is an explanatory diagram illustrating a magnetic sensor before rearrangement.
Figure 1C:
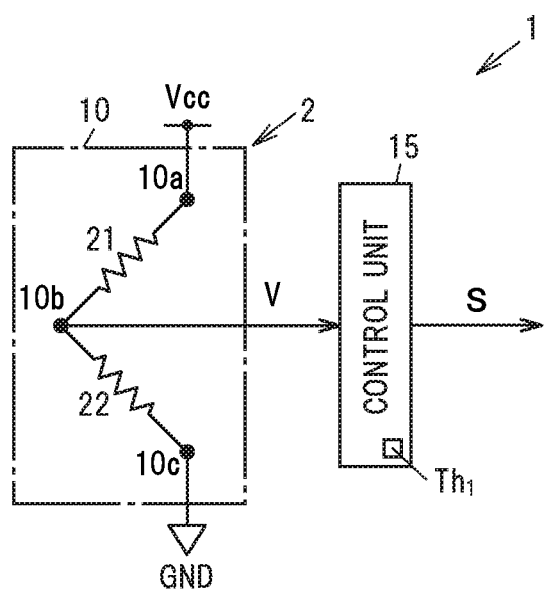
FIG. 1C is an equivalent circuit diagram illustrating the magnetic sensor device in the first embodiment.
Figure 2A:
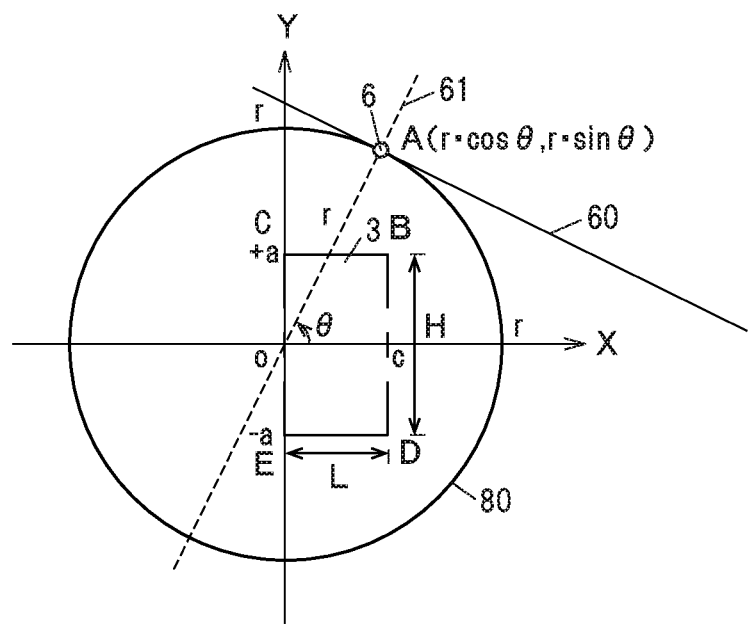
FIG. 2A is an explanatory diagram for explaining rearrangement of a circular magneto-resistive element of the magnetic sensor device in the first embodiment.
Figure 2B:
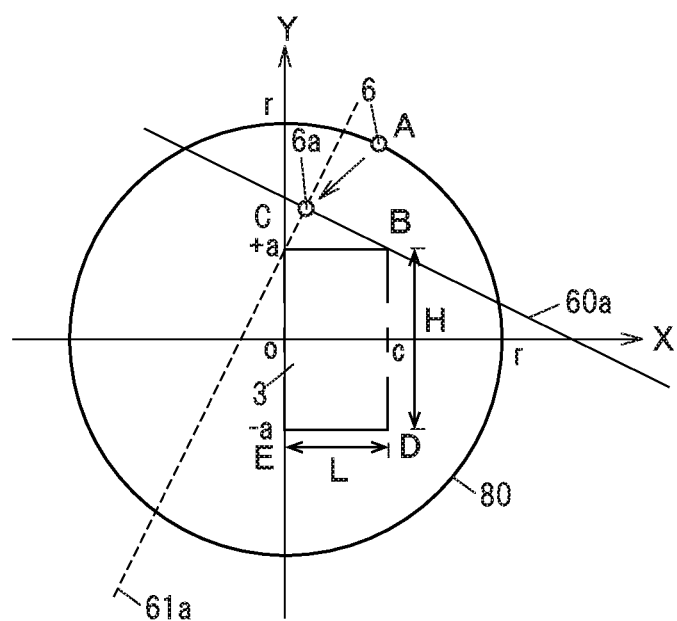
FIG. 2B is an explanatory diagram for explaining rearrangement of the circular magneto-resistive element of the magnetic sensor device in the first embodiment.
Figure 3A:
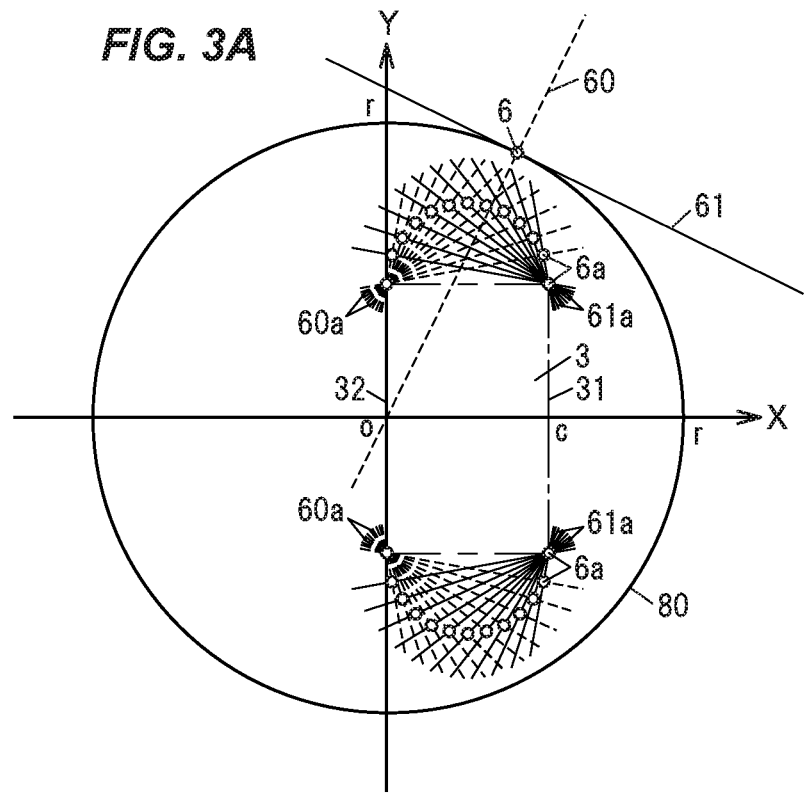
FIG. 3A is an explanatory diagram for explaining a relation between tangent line and normal line when rearranging the circular magneto-resistive element of the magnetic sensor device in the first embodiment.
Figure 3B:
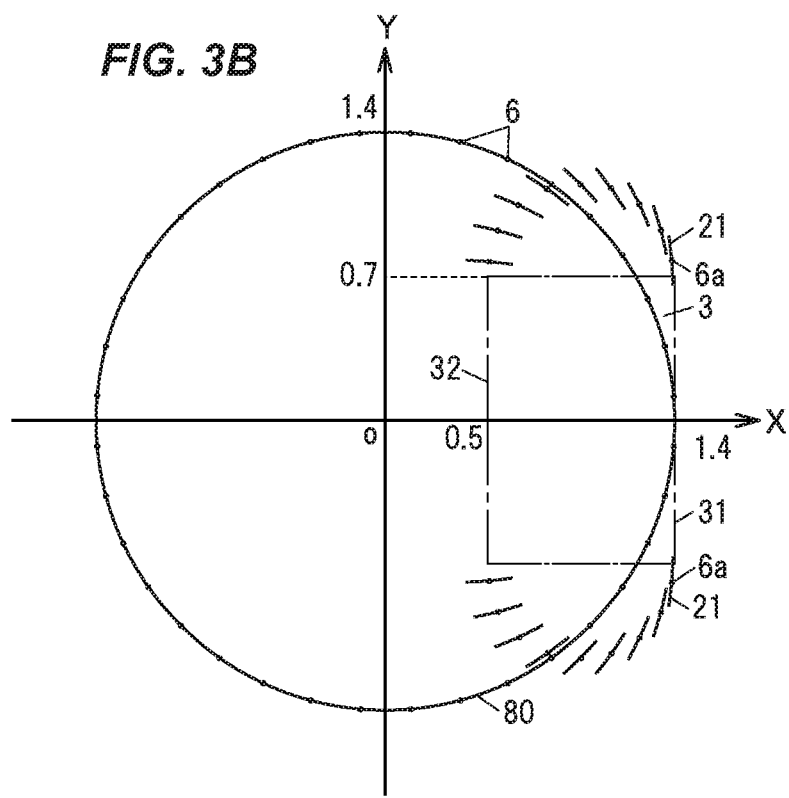
FIG. 3B is an explanatory diagram illustrating rotation of divided elements of the magnetic sensor device in the first embodiment.

FIG. 1A is an explanatory diagram illustrating a magnetic sensor device in the first embodiment, FIG. 1B is an explanatory diagram illustrating a magnetic sensor before rearrangement, and FIG. 1C is an equivalent circuit diagram illustrating the magnetic sensor device. FIGS. 2A and 2B are explanatory diagrams for explaining rearrangement of a circular magneto-resistive element of the magnetic sensor device in the first embodiment. FIG. 3A is an explanatory diagram for explaining a relation between tangent line and normal line when rearranging the circular magneto-resistive element of the magnetic sensor device in the first embodiment, and FIG. 3B is an explanatory diagram illustrating rotation of divided elements of the magnetic sensor device in the first embodiment.

In each drawing of the embodiments described below, a scale ratio may be different from an actual ratio. In addition, in FIGS. 1C and 7B, flows of main signal and information are indicated by arrows.

A magnetic sensor device 1 detects, e.g., approach or separation of a magnet 5 to/from the magnetic sensor device 1. As an example, the magnetic sensor device 1 is used in a non-contact switch which detects ON and OFF, or in a device which detects two states such as an operation device detecting whether or not an operation is performed on an operation portion. The magnetic sensor device 1 in the first embodiment is used in a non-contact switch which determines approach of the magnet 5 as ON and separation as OFF, as an example.

The magnetic sensor device 1 has, e.g., a switching region 3 defined by a switching range L, which is set in a stroke direction of the magnet 5 generating a radial magnetic field 50 and defined by a start position 31 and an end position 32 for switching of the state, and a variation range H, which is set in a direction intersecting the stroke direction and is a range of variation in the position of the magnet 5, and a magnetic sensor 2 having plural divided elements 21 (the first divided elements) which are formed by dividing a circular magneto-resistive element 80 (the first circular magneto-resistive element) and are consecutively rotated and rearranged around the switching region 3 such that change in a magnetoresistance value due to the magnetic field 50 of the magnet 5 in the switching region 3 increases from the start position 31 to the end position 32, as shown in FIGS. 1A to 1C.

In the first embodiment, the divided elements 21 are rearranged so as to be parallel to the magnetic field 50 when a center 51 of the magnet 5 coincides with the start position 31, and so as to be perpendicular to the magnetic field 50 when the center 51 coincides with the end position 32. However, it is not limited thereto and the divided elements 21 may be rearranged so as to be perpendicular at the start position 31 and parallel at the end position 32. When rearranged in an opposite manner, the magnetic sensor device 1 is configured to determine, e.g., the switching from ON to OFF when an output voltage V output from the magnetic sensor 2 becomes not more than a threshold value $Th_1$ (described later).

"The center 51 of the magnet 5 coincides with the start position 31", etc. means that, e.g., a point obtained by projecting the center 51 onto an XY-coordinate system coincides with the start position 31, etc. That is, the magnet 5 is located above a plane of the XY-coordinate system.

The stroke direction is, e.g., a direction indicated by an arrow in FIG. 1A. The switching range L is, e.g., a range between the start position 31 and the end position 32 which are indicated by dashed-dotted lines in FIG. 1A. The magnetic sensor device 1 is configured such that the state is switched from OFF to ON, etc., when the center 51 of the magnet 5 is located between the start position 31 and the end position 32. The variation range H indicates a range of the relative misalignment between the magnet 5 and the magnetic sensor 2. The variation range H shown in FIG. 1A indicates a range of misalignment of the magnet 5 relative to the magnetic sensor 2 in a direction intersecting the stroke direction. The switching region 3 is, e.g., a region surrounded by dashed-dotted lines in FIG. 1A. For example, the center 51 of the magnet 5 is located in the variation range H.

The circular magneto-resistive element 80 is, e.g., a magneto-resistive element formed in a circular shape, as shown in FIG. 1B. In the magnetic sensor 2 in the first embodiment, the divided elements 21 obtained by dividing the circular magneto-resistive element 80 into equal parts are rearranged. In this regard, the circular magneto-resistive element 80 when used is partially cut out and is connected to a wiring.

In the magnetic sensor device 1, when, e.g., a Cartesian coordinate system with the origin at the center of the circular magneto-resistive element 80 is provided such that the switching range L is set within the positive half of the x-axis parallel to the stroke direction and the variation range H is set across the positive and negative halves of the y-axis, the magnetic sensor 2 is configured that the divided elements 21 are rearranged in such a manner that tangent lines 60 to center points 6 (the point A) of the divided elements 21 before being moved and normal lines 61 orthogonal to the tangent lines 60 are moved to pass through two vertices (the point C and the point B) of the switching region 3 in the first quadrant or two vertices (the point D and the point E) in the fourth quadrant and tangent lines 60a after being moved are tangential to intersection points 6a between the moved tangent lines 60 and the moved normal lines 61, as shown in FIGS. 2A and 2B.

The switching range L shown in FIGS. 2A and 2B is from (0, 0) to (c, 0) and the variation range H is from (−a, 0) to (+a, 0), where c>0 and a>0.

The coordinates of the center point 6 are (r·cos θ, r·sin θ) when represented in polar coordinates, where r is the radius of the circular magneto-resistive element 80 and θ is an angle formed by the x-axis and the normal line 61. The point B is at (c, a). The point C is at (0, a). The point D is at (c, −a). The point E is at (0, −a).

The magnetic sensor 2 has, e.g., linear elements 22 arranged on moved normal lines 61a passing through the center points 6 of the divided elements 21, as shown in FIGS. 1A, 2A and 2B. In the magnetic sensor 2, plural unit elements 20 each composed of the divided element 21 and the linear element 22 are arranged at the intersection points 6a and a half-bridge circuit 10 is formed by electrically connecting the plural divided elements 21 in series and electrically connecting the plural linear elements 22 in series.

The linear elements 22 act in the same manner as, e.g., radial magneto-resistive elements 81 (first radial magneto-resistive elements) shown in FIG. 1B.

The radial magneto-resistive elements 81, together with the circular magneto-resistive element 80, form a half-bridge circuit to detect approach and separation of a magnet. For this reason, the radial magneto-resistive elements 81 are arranged along normal lines orthogonal to tangent lines to the circular magneto-resistive element 80 and have resistance values equal to that of the circular magneto-resistive element 80 when the magnetic field is not acting. Therefore, in a magnetic sensor 8, since the radial magneto-resistive elements 81 are arranged perpendicular to the circular magneto-resistive element 80, arrangement is different by 90 degrees and the amount of change in the possible magnetoresistance value is maximized.

The half-bridge circuit 10 of the magnetic sensor device 1 outputs, e.g., the output voltage V as a midpoint potential to a control unit 15, as shown in FIG. 1C. A node 10a at one end of the series-connected plural divided elements 21 is electrically connected to a source voltage $V_{CC}$. A node 10c at one end of the series-connected plural linear elements 22 is electrically connected to GND. The half-bridge circuit 10 outputs the output voltage V of a node 10b between the series-connected plural divided elements 21 and the series-connected plural linear elements 22.

(Configuration of the Magnetic Sensor 2)

The magnetic sensor 2 has the plural unit elements 20 each composed of the divided element 21 and the linear element 22. The divided element 21 does not need to have an arc shape and may be linear since the intersection point 6a described later can be expressed as being not included by the radius r.

The divided elements 21 and the linear elements 22 are formed as, e.g., thin alloy films consisting mainly of a ferromagnetic metal such as Ni or Fe. The divided elements 21, and also the linear elements 22, are connected at respective ends by a metal material of which resistance value does not change with the change in the direction of the magnetic field 50, such as copper, such that elements of the same type are connected in series.

The resistance components not changing even under the action of the magnetic field 50, the magnetoresistance components changing under the action of the magnetic field 50, and the total resistance value of the divided elements 21 are respectively equal to those of the linear elements 22.

(Configuration of the Magnet 5)

The magnet 5 has, e.g., a shape of a sphere, a column or a quadrangular prism, etc., which generates the radial magnetic field 50, as shown in FIG. 1A. The magnet 5 in the first embodiment has, e.g., a quadrangular prism shape.

The magnet 5 is magnetized to have, e.g., an N-pole on the magnetic sensor 2 side and an S-pole on the other side, as shown in FIG. 1A. Thus, the magnetic field 50 flowing from the inside toward the outside acts on a plane in which the magnetic sensor 2 is placed. The magnetic poles of the magnet 5 may be located the other way round.

The magnet 5 is obtained by, e.g., shaping a permanent magnet such as alnico magnet, ferrite magnet or neodymium magnet into a desired shape, or by mixing a magnetic material based on ferrite, neodymium, samarium-cobalt or samarium-iron-nitrogen, etc., with a synthetic resin material and shaping into a desired shape. The magnet 5 in the first embodiment is a permanent magnet, as an example. Alternatively, the magnet 5 may be an electromagnet.

(Configuration of the Control Unit 15)

The control unit 15 is, e.g., a microcomputer composed of a CPU (Central Processing Unit) performing calculation and processing, etc., of the acquired data according to a stored program, and a RAM (Random Access Memory) and a ROM (Read Only Memory) which are semiconductor memories, etc. The ROM stores, e.g., a program for operation of the control unit 15, and the threshold value $Th_1$. The RAM is used as, e.g., a storage area for temporarily storing calculation results, etc.

The control unit 15 compares, e.g., the output voltage V output from the half-bridge circuit 10 with the threshold value $Th_1$ and determines whether or not the magnet 5 is proximate. The threshold value $Th_1$ is set based on, e.g., the output voltage V obtained when the position of the magnet 5 is not misaligned and the center 51 of the magnet 5 is located at the start position 31, and the output voltage V obtained when the misalignment of the position of the magnet 5 is the maximum and the center 51 of the magnet 5 is located at the point C and the point E. That is, the threshold value $Th_1$ is set such that the state is switched at an inside of the switching region 3 from the start position 31 when there is no misalignment of the position of the magnet 5 and the state is switched at an inside of the switching region 3 from the end position 32 when misalignment of the position of the magnet 5 is the maximum.

When a disturbance magnetic field 9 acts on the magnetic sensor device 1, e.g., the magnetic field acts in the same direction on the divided elements 21 and the linear elements 22.

Therefore, ON is unlikely to be determined since the magnetoresistance values of the divided elements 21 and the linear elements 22 are similar to those when the magnet 5 is located outside the magnetic sensor 2. That is, the magnetic sensor device 1 can prevent erroneous determination in which ON is determined due to the action of the disturbance magnetic field 9.

(Rearrangement of the Circular Magneto-Resistive Element 80)

Figure 4A:
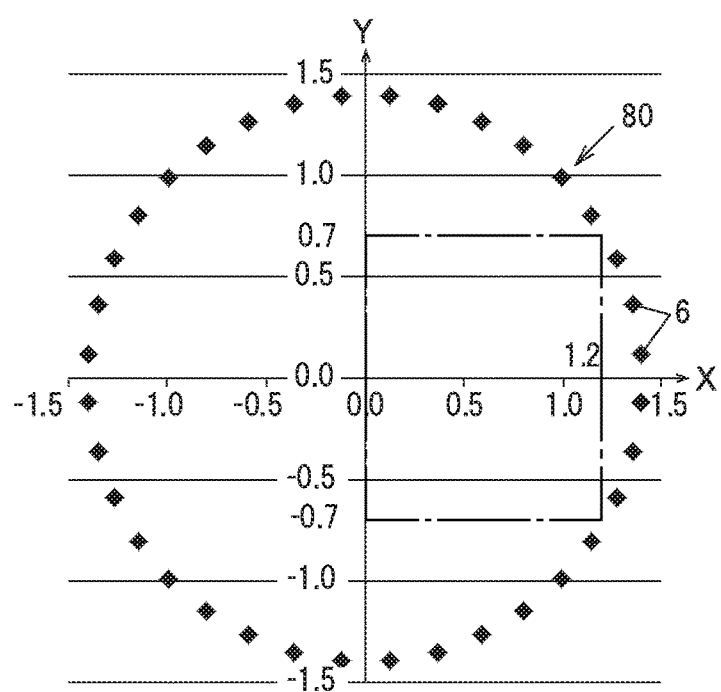
FIG. 4A is a graph showing the center of the magnetic sensor device in the first embodiment before rearrangement.
Figure 4B:
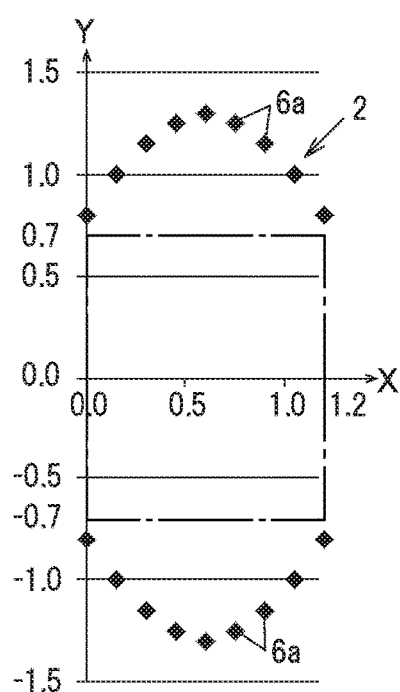
FIG. 4B is a graph showing the center of the magnetic sensor device in the first embodiment after rearrangement.
Figure 5A:
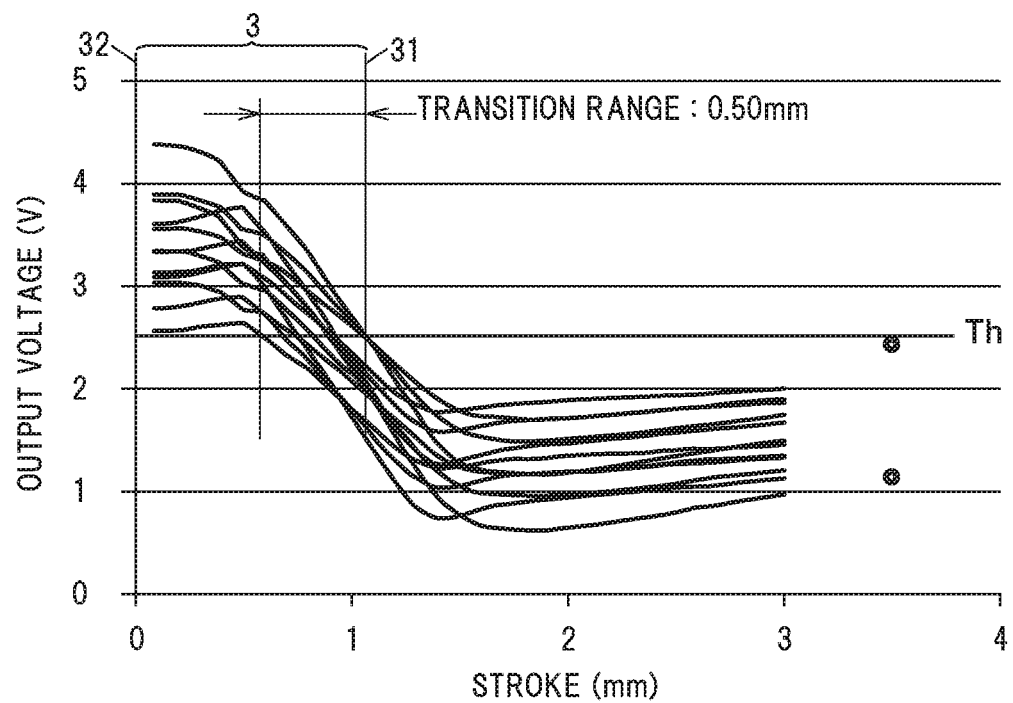
FIG. 5A is a graph showing a relation between stroke and output voltage of the magnetic sensor device in the first embodiment.
Figure 5B:
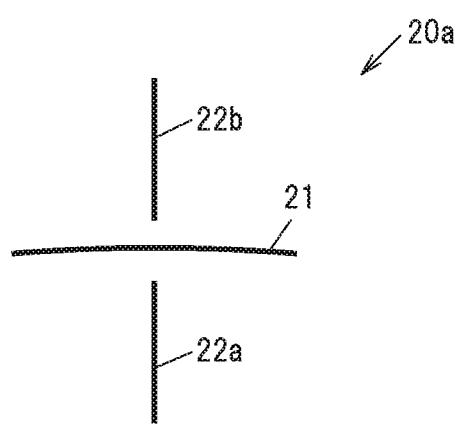
FIG. 5B is an explanatory diagram illustrating a modification of a unit element of the magnetic sensor device in the first embodiment.

FIG. 4A is a graph showing the center of the magnetic sensor device in the first embodiment before rearrangement, and FIG. 4B is a graph showing the center after rearrangement. FIG. 5A is a graph showing a relation between stroke and output voltage of the magnetic sensor device in the first embodiment, and FIG. 5B is an explanatory diagram illustrating the unit element in a modification.

When, e.g., the center 51 of the magnet 5 coincides with the x-axis shown in FIG. 2A and also coincides with the center (the origin) of the circular magneto-resistive element 80 which is the switching position, the magnetic field 50 acts perpendicularly on the circular magneto-resistive element 80 which thus has the lowest magnetoresistance value.

However, when the position of the magnet 5 deviates from the x-axis and the center 51 of the magnet 5 then reaches the y-axis which is the end position 32, the magnetic field 50 along the y-axis is perpendicular to the circular magneto-resistive element 80 but an angle of the remaining portion of the magnetic field 50 is not perpendicular to the circular magneto-resistive element 80. As a result, the magnetoresistance value may not decrease enough to determine ON.

To sufficiently reduce the magnetoresistance value within the switching region 3 even when the position of the magnet 5 is misaligned, it is necessary to increase the diameter of the circular magneto-resistive element 80, which causes a problem in that the size of the device is increased.

In the magnetic sensor device 1 of the first embodiment, it is possible to achieve both improvement in switching accuracy and size reduction by dividing the circular magneto-resistive element 80 and then rearranging the thereby obtained divided elements 21 according to the equations below.

Firstly, the ideal arrangement portion of the magnet 5 is where. e.g., a point obtained by projecting the center 51 is located on the x-axis. Then, when, e.g., the variation range H in which the position of the center 51 of the magnet 5 varies is set to from +a to −a and the start position 31 and the end position 32 of the switching range L on the x-axis are respectively set to c and the origin, the switching region 3 is defined, e.g., as shown in FIGS. 2A, 2B and 3A.

When variation in the arrangement position is largest, the center 51 of the magnet 5 passes the points B and C of the switching region 3 in the first quadrant of the XY-coordinate system or the points D and E in the fourth quadrant of the XY-coordinate system. The points B to E are four vertices of the switching region 3.

Switching accuracy of the magnetic sensor device 1 is improved when the rearrangement is done such that the amount of change in the magnetoresistance value due to the action of the magnetic field 50 is maximized at the points B and C or the points D and E at which deviation of the magnet 5 from the x-axis is the largest. That is, since the amount of change in the output voltage V within the switching region 3 is large in the magnetic sensor device 1, switching accuracy is improved.

To achieve this, each tangent line 60 and each normal line 61 are translated such that the tangent line 60 passing a point (the point A) on the circular magneto-resistive element 80 passes the point B and the normal line 61 passes the point C. The tangent line 60 and the normal line 61 are expressed by the following equations (1) and (2).

$$Y=-(\cos\theta/\sin\theta)X+r/\sin\theta \quad (1)$$

$$Y=(\sin\theta/\cos\theta)X \quad (2)$$

Since the tangent line 60 passes the point B (c, a) while keeping its fixed inclination, the tangent line 60a after the parallel translation is expressed by the following equation (3).

$$Y=-(\cos\theta/\sin\theta)X+a+c(\cos\theta/\sin\theta) \quad (3)$$

Since the normal line 61 passes the point C (0, a) while keeping its fixed inclination, the normal line 61a after the parallel translation is expressed by the following equation (4).

$$Y=(\sin\theta/\cos\theta)X+a \quad (4)$$

Each unit element 20 is rearranged on the intersection point 6a between the tangent line 60a expressed by the equation (3) and the normal line 61a expressed by the equation (4). The coordinates of the intersection point 6a are (c·cos 2θ, c~sin θ~cos θ+a), where r is the radius of the circular magneto-resistive element 80 and θ is an angle formed by the x-axis and the normal line 61.

The unit elements 20 are arranged such that, e.g., the divided elements 21 are rotated such that the divided elements 21 are orthogonal to the moved normal line 61a, as shown in FIG. 3B. Then, the linear elements 22 are rotated such that the linear elements 22 are orthogonal to the divided elements 21.

According to the calculation, the intersection points 6a (c~cos 2θ, c~sin θ·cos θ+a) are present not only around the switching region 3 but also inside the switching region 3. In particular, the intersection points 6a for the divided elements 21 in the second and third quadrants of the circular magneto-resistive element 80 are present inside the switching region 3. However, as an example, when the magnet 5 moves on the x-axis, the direction of the magnetic field 50 acting on the opposite unit elements 20 is the same and the changes in the magnetoresistance value cancel each other out. For this reason, the intersection points 6a are not arranged inside the switching region 3. In other words, when the switching region 3 is located in the first and fourth quadrants, only the divided elements 21 in the first and fourth quadrants of the circular magneto-resistive element 80 are rearranged.

FIG. 4A shows an example in which the radius r of the circular magneto-resistive element 80 is 1.4 mm (the diameter of 2.8 mm), the x-coordinate c of the start position 31 of the switching range L is 1.2 (mm), the x-coordinate of the end position 32 is 0 (mm), the deviation a of the magnet 5 is 0.7 mm, and the thirty-six equally divided elements 21 are rearranged. The square symbols in FIGS. 4A and 4B indicate the centers of the divided elements 21.

The outer size of the circular magneto-resistive element 80 before rearrangement is 2.8 mm×2.8 mm (X×Y). Therefore, the area occupied thereby is 7.8 mm² (=2.8 mm×2.8 mm) as the area of the rectangle in which the circular magneto-resistive element 80 is inscribed, and is 6.2 mm² (=1.4 mm×1.4 mm×π) as the area of the circle.

Meanwhile, the outer size of the magnetic sensor 2 formed by rearrangement is as follows: the width in the x-axis direction, which is the range of the intersection points 6a, is 1.2 mm, and the width in the y-axis direction, which is a distance between the peaks of the intersection points 6a, is 2.6 mm (=1.3 mm×2: θ=45°, 315°). Thus, the area occupied by the magnetic sensor 2 is 3.1 mm² (=1.2 mm 2.6 mm) as the area of the rectangle in which the magnetic sensor 2 is inscribed, and is 2.8 mm² (=1.2 mm×0.7 mm×2+ 0.6 mm×0.6 mm×π) as the area of the magnetic sensor 2.

The area of the magnetic sensor 2 is the sum of the area of the switching region 3 (1.2 mm×1.4 mm) and the area outside the switching region 3. The area outside the switching region 3 was approximately calculated as an area of a circle with a radius of 0.6 mm since the peak is at 1.3 mm (−1.3 mm), the height from the switching region 3 (0.7 mm, −0.7 mm) is 0.6 mm, and the width is 1.2 mm.

As a result, the area occupied by the magnetic sensor 2 is about 40%, as the rectangle, and about 45%, as the inner area, of the area occupied by the circular magneto-resistive element 80 before rearrangement, hence, about 60% of size reduction. The area occupied by the magnetic sensor 2 changes depending on the setting of the switching region 3.

FIG. 5A is a graph of output voltage calculated according as the magnet 5 gets close to the magnetic sensor 2 at various positions. In FIG. 5A, the horizontal axis indicates the stroke (mm) of the magnet 5 and the vertical axis indicates the measured output voltage (V).

In the example of FIG. 5A, the position of the magnet 5 in a direction perpendicular to the x-axis is displaced in increments of 0.7 mm from the x-axis. The output voltage measured as such exceeds the threshold value $Th_1$ within the switching region 3 which is set from the start position 31 to the end position 32. That is, with the magnetic sensor device 1, switching between ON and OFF occurs within the switching region 3 even when the position of the magnet 5 is misaligned.

In addition, the transition range of the magnetic sensor device 1 is about 0.5 mm even when the position is misaligned. This is shorter than the set distance (1.2 mm) between the start position 31 (1.2 mm) and the end position 32 (0 mm). On the other hand, the transition range of the magnetic sensor 8 before the rearrangement was about 0.89 mm as a result of measurement using the same threshold value $Th_1$. Thus, the magnetic sensor device 1 has 0.39 mm of improvement in accuracy as compared to the magnetic sensor 8 before the rearrangement.

Meanwhile, the double circles in FIG. 5A indicate the output voltage when the disturbance magnetic field 9 stronger than the magnetic field 50 of the magnet 50 is applied. The disturbance magnetic field 9 acts on the magnetic sensor 2 in the same direction. For example, as shown in FIG. 1A, the direction of the disturbance magnetic field 9 acting on the divided element 21 at the point B of the switching region 3 is the same as the direction of the disturbance magnetic field 9 acting on the linear element 22 at the point E. Then, the direction of the disturbance magnetic field 9 acting on the linear element 22 at the point B is the same as the direction of the disturbance magnetic field 9 acting on the divided element 21 at the point E. Thus, the resistance value of the divided element 21 at the point B is equal to that of the linear element 22 at the point E, and the resistance value of the linear element 22 at the point B is equal to that of the divided element 21 at the point E.

This also applies to the other unit elements 20. Therefore, in the magnetic sensor device 1, the midpoint potential (the output voltage V) of the half-bridge circuit 10 is maintained and output is not inverted.

Due to the above, the magnetic sensor device 1 is unlikely to determine ON even under the action of the disturbance magnetic field 9 and thus can be suitably used in an environment in which the disturbance magnetic field 9 is likely to be generated, such as in vehicle, as compared to when such a configuration is not adopted.

FIG. 5B is an explanatory diagram illustrating the unit element in a modification. A unit element 20a in the modification is configured such that, e.g., two linear elements 22a and 22b are aligned on the normal line 61a passing through the center point of the divided element 21 (the intersection point 6a) so as to sandwich the divided element 21 therebetween. In this case, the resistance value, including the magnetoresistance value, of the linear elements 22a and 22b are equal to the resistance value, including the magnetoresistance value, of the divided element 21.

Next, an example of an operation of the magnetic sensor device 1 in the first embodiment will be described.

(Operation)

When the power is turned on, the control unit 15 of the magnetic sensor device 1 monitors the output voltage V. When the output voltage V becomes not less than threshold value $Th_1$, the control unit 15 determines that the magnet 5 is located in the switching region 3, i.e., it is ON.

Based on the determination result, the control unit 15 generates detection information S indicating determination of "ON" and outputs it to a connected electronic device.

Effects of the First Embodiment

The magnetic sensor device 1 in the first embodiment can be reduced in size while having an endurance to the disturbance magnetic field 9. In detail, the magnetic sensor device 1 is configured such that the magnetic field 50 and the divided element 21 are parallel at the start position 31 of the switching region 3 and perpendicular at the end position 32 and the amount of change in the possible magnetoresistance value is maximized. Therefore, switching accuracy is high while having a small size even after division and rearrangement. In addition, since the circular magneto-resistive element 80 is divided and rearranged, the magnetic sensor device 1 has a high endurance to the disturbance magnetic field 9. As such, the magnetic sensor device can be reduced in size while having an endurance to the disturbance magnetic field 9, as compared to when not dividing.

Second Embodiment

The second embodiment is different from the other embodiment in that the magnetic sensor device 1 has a full-bridge circuit.

Figure 6A:
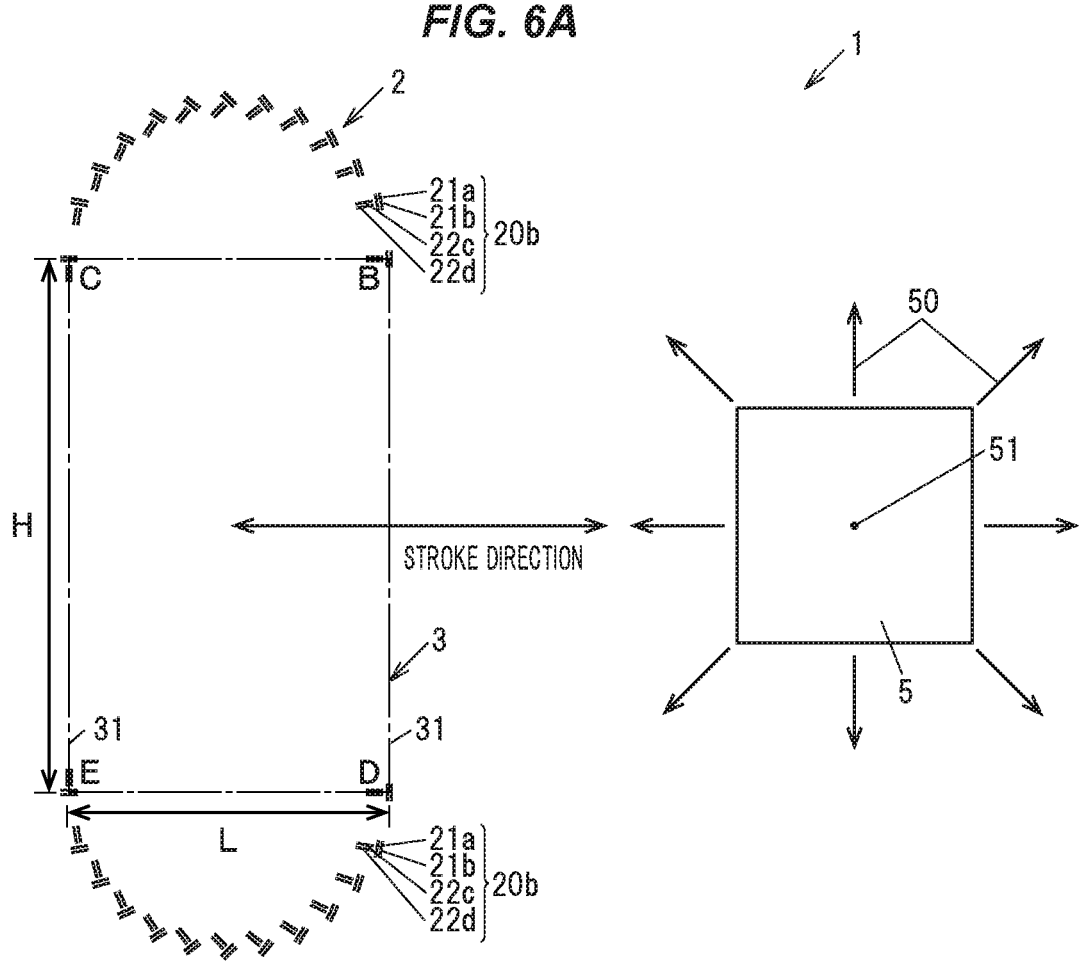
FIG. 6A is an explanatory diagram illustrating the magnetic sensor device in the second embodiment.
Figure 6B:
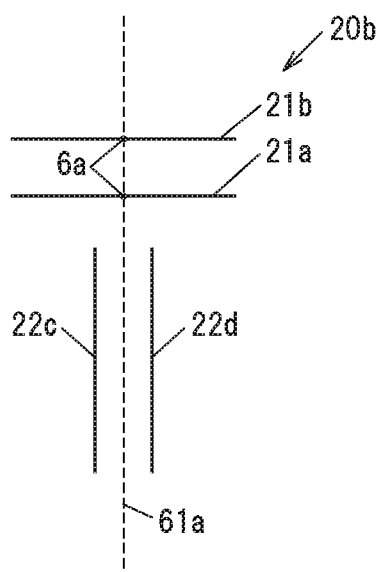
FIG. 6B is an explanatory diagram illustrating the unit element of the magnetic sensor device in the second embodiment.
Figure 7A:
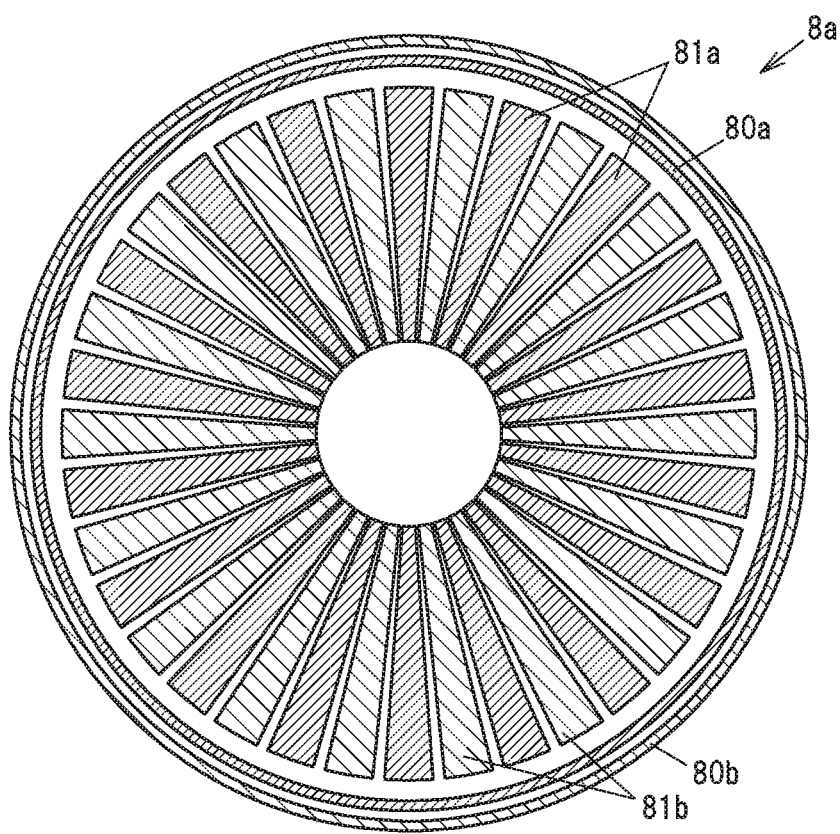
FIG. 7A is an explanatory diagram illustrating the magnetic sensor of the magnetic sensor device in the second embodiment before rearrangement.
Figure 7B:
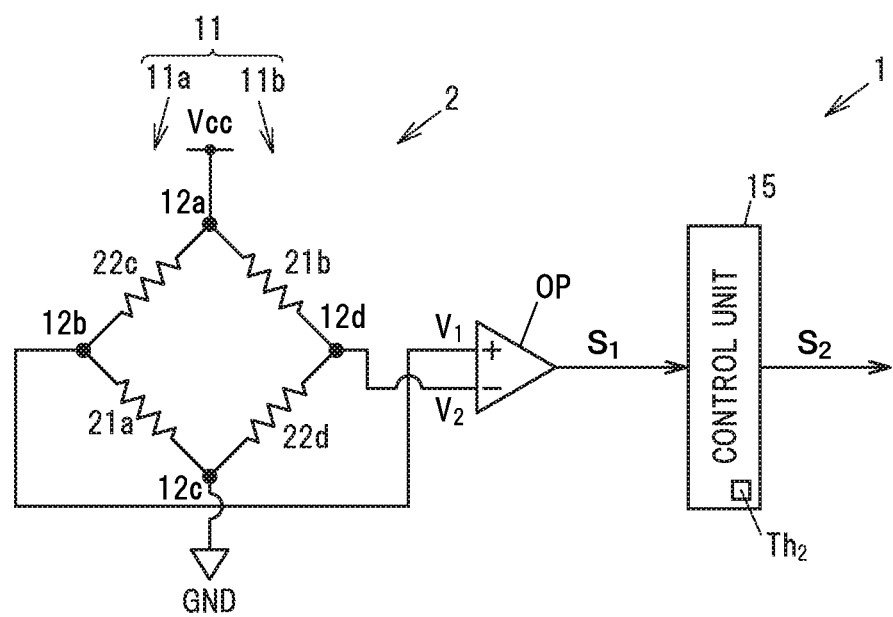
FIG. 7B is an equivalent circuit diagram illustrating the magnetic sensor device in the second embodiment.

FIG. 6A is an explanatory diagram illustrating the magnetic sensor device in the second embodiment, and FIG. 6B is an explanatory diagram illustrating the unit element. FIG. 7A is an explanatory diagram illustrating the magnetic sensor of the magnetic sensor device in the second embodiment before rearrangement, and FIG. 7B is an equivalent circuit diagram illustrating the magnetic sensor device. In the embodiment described below, portions having the same functions and configurations as those in the first embodiment are denoted by the same reference numerals as the first embodiment and the explanation thereof will be omitted.

The magnetic sensor 2 of the magnetic sensor device 1 in the second embodiment is provided with, e.g., first linear elements (linear elements 22c) arranged parallel to the normal lines 61a passing through the center points (the intersection points 6a) of the first divided elements (divided elements 21a), second divided elements (divided elements 21b) formed by dividing a second circular magneto-resistive element (a circular magneto-resistive element 80b) being concentric with and having a different radius from the first circular magneto-resistive element (a circular magneto-resistive element 80a) in the same manner as when dividing the first circular magneto-resistive element, and second linear elements (linear elements 22d) parallel to the first linear elements, as shown in FIGS. 6A, 6B and 7B.

In addition, a first half-bridge circuit 11a is formed by electrically connecting the plural first divided elements (the divided elements 21a) in series and electrically connecting the plural first linear elements (the linear elements 22c) in series. Furthermore, a second half-bridge circuit 11b is formed by electrically connecting the plural second divided elements (the divided elements 21b) in series and electrically connecting the plural second linear elements (the linear elements 22d) in series. Then, a full-bridge circuit 11 is formed by the first half-bridge circuit 11a and the second half-bridge circuit 11b.

The linear elements 22c and the linear elements 22d act in the same manner as, e.g., radial magneto-resistive elements 81a and radial magneto-resistive elements 81b shown in FIG. 7A. The combination of the divided elements and the linear elements is not limited as long as the half-bridge circuits are not formed of a combination of the divided elements 21a and the divided elements 21b and a combination of the linear elements 22c and the linear elements 22d.

The first half-bridge circuit 11a is configured that a node 12a at one end of the linear elements 22c is electrically connected to the source voltage $V_{CC}$ and a node 12c at one end of the divided elements 21a is electrically connected to the GND. Then, a midpoint potential $V_1$ at a node 12b between the linear elements 22c and the divided elements 21a is output from the first half-bridge circuit 11a to a non-inverting (+ side) input terminal of an op-amp OP.

The second half-bridge circuit 11b is configured that the node 12a at one end of the divided elements 21b is electrically connected to the source voltage $V_{CC}$ and the node 12c at one end of the linear elements 22d is electrically connected to the GND. Then, a midpoint potential $V_2$ at a node 12d between the divided elements 21b and the linear elements 22d is output from the second half-bridge circuit 11b to an inverting (− side) input terminal of the op-amp OP.

The op-amp OP outputs an output signal $S_1$, which is obtained by differentially amplifying the midpoint potential $V_1$ input to the non-inverting input terminal and the midpoint potential $V_2$ input to the inverting input terminal, to the control unit 15.

The control unit 15 compares the output signal $S_1$ output from the op-amp OP with a threshold value $Th_2$ and determines ON or OFF. The control unit 15 generates and outputs, e.g., detection information $S_2$ indicating that the state is switched from OFF to ON.

The divided elements 21a and the divided elements 21b are obtained by rearranging the circular magneto-resistive element 80a and the circular magneto-resistive element 80b, using the same method as in the first embodiment. The linear element 22c and the linear element 22d are aligned, e.g., so as to be parallel to the normal line 61a passing through the center points of the divided element 21a and the divided element 21b (the intersection points 6a) as shown in FIG. 6B because they overlap with each other if arranged on the normal line 61a. However, the arrangement of the linear element 22c and the linear element 22d is not limited thereto and may be, e.g., both arranged on the normal line 61a so as to sandwich the divided element 21a and the divided element 21b therebetween as in the modification shown in FIG. 5B.

When the magnet 5 is located outside the switching region 3 of the magnetic sensor 2, the magnetic field 50 acts in substantially the same direction. Therefore, the midpoint potential $V_1$ and the midpoint potential $V_2$ of the full-bridge circuit 11 are substantially equal and the value of the output signal $S_1$ becomes close to zero. The control unit 15 compares the output signal $S_1$ with the threshold value $Th_2$ and determines OFF when the output signal $S_1$ is lower than the threshold value $Th_2$.

On the other hand, when the magnet 5 is located in the switching region 3 of the magnetic sensor 2, the magnetic field 50 acts on the divided elements 21a and 21b and the linear elements 22c and 22d at different angles. Therefore, the midpoint potential $V_1$ and the midpoint potential $V_2$ of the full-bridge circuit 11 are different. Then, the control unit 15 determines ON when the output signal $S_1$ is not less than the threshold value $Th_2$.

Also when the disturbance magnetic field 9 acts, the value of the output signal $S_1$ becomes close to zero since the magnetic field in the same direction acts in the same manner as when the magnet 5 is located outside the switching region 3, hence, the magnetic sensor device 1 is prevented from erroneously determining that it is ON, in the same manner as the first embodiment.

Effects of the Second Embodiment

In the magnetic sensor device 1 in the second embodiment, the circular magneto-resistive element 80a and the circular magneto-resistive element 80b are rearranged as the divided elements 21a and the divided elements 21b, and the linear elements 22c and the linear elements 22d acting in the same manner as the radial magneto-resistive elements 81a and the radial magneto-resistive elements 81b are also arranged. Therefore, the magnetic sensor device 1 can be reduced in size as compared to a magnetic sensor 8a which is composed of the circular magneto-resistive element 80a, the circular magneto-resistive element 80b, the radial magneto-resistive elements 81a and the radial magneto-resistive elements 81b.

The magnetic sensor device 1 in at least one of the above-described embodiments can be reduced in size while having an endurance to the disturbance magnetic field 9. Although some embodiments and modifications of the invention have been described, the embodiments and modifications are merely examples and the invention according to claims is not to be limited thereto. These new embodiments and modifications may be implemented in various other forms, and various omissions, substitutions and changes, etc., can be made without departing from the gist of the invention. In addition, all combinations of the features described in the embodiments and modifications are not necessary to solve the problem of the invention. Further, these embodiments and modifications are included within the scope and gist of the invention and also within the invention described in the claims and the range of equivalency.

REFERENCE SIGNS LIST

1 MAGNETIC SENSOR DEVICE
2 MAGNETIC SENSOR
3 SWITCHING REGION
5 MAGNET
6 CENTER POINT
6a INTERSECTION POINT
8, 8a MAGNETIC SENSOR
10 HALF-BRIDGE CIRCUIT
11 FULL-BRIDGE CIRCUIT
11a FIRST HALF-BRIDGE CIRCUIT
11b SECOND HALF-BRIDGE CIRCUIT
15 CONTROL UNIT
20, 20a UNIT ELEMENT
21, 21a. 21b DIVIDED ELEMENT
22, 22a to 22d LINEAR ELEMENT
31 START POSITION
32 END POSITION
50 MAGNETIC FIELD
51 CENTER
60, 60a TANGENT LINE
61, 61a NORMAL LINE
80, 80a, 80b CIRCULAR MAGNETO-RESISTIVE ELEMENT

The invention claimed is:
1. A magnetic sensor device comprising:
a switching region defined by a switching range and a variation range, the switching range being set in a stroke direction of a magnet generating a radial magnetic field and defined by a start position and an end position for switching of the state, and the variation range beings set in a direction intersecting the stroke direction and being a range of variation in the position of the magnet; and
a magnetic sensor comprising a plurality of first divided elements that are formed by dividing a first circular magneto-resistive element, wherein each first divided element of the plurality of first divided elements is arranged so as to be asymmetrical to each other and rearranged around the switching region such that change in a magnetoresistance value due to the magnetic field of the magnet in the switching region increases from the start position to the end position, and wherein, when a Cartesian coordinate system with the origin at a center of the first circular magneto-resistive element is provided such that the switching range is set within a positive half of an x-axis parallel to the stroke direction and the variation range is set across the positive and negative halves of a y-axis, the magnetic sensor is configured that the first divided elements are rearranged in such a manner that tangent lines to center points of the first divided elements before being moved and normal lines orthogonal to the tangent lines are moved to pass through two vertices of the switching region in a first quadrant or two vertices in a fourth quadrant, and the moved tangent lines are tangential to intersection points between the moved tangent lines and the moved normal lines.

2. The magnetic sensor device according to claim 1, wherein the magnetic sensor comprises first linear elements arranged on the moved normal lines passing through the center points of the first divided elements, a plurality of unit elements each comprising the first divided element and the first linear element are arranged at the intersection points, and a half-bridge circuit is formed by electrically connecting the plurality of first divided elements in series and electrically connecting the plurality of first linear elements in series.

3. The magnetic sensor device according to claim 2, wherein the first linear element comprises two linear elements that are aligned on the moved normal line passing through the center point of the first divided element such that the first divided element is sandwiched therebetween.

4. The magnetic sensor device according to claim 2, further comprising:
a controller that compares output voltage, as a midpoint potential output from the half-bridge circuit, with a threshold value and determines whether or not the magnet is proximate.

5. The magnetic sensor device according to claim 2, wherein resistance components not changing even under the action of the magnetic field, magnetoresistance components changing under the action of the magnetic field and a total resistance value of the first and second divided elements are respectively equal to those of the first and second linear elements.

6. The magnetic sensor device according to claim 2, wherein the first and second divided elements and the first and second linear elements comprise thin alloy films that comprise mainly a ferromagnetic metal comprising nickel (Ni) or iron (Fe).

7. The magnetic sensor device according to claim 1, wherein the magnetic sensor comprises first linear elements arranged parallel to normal lines passing through the center points of the first divided elements, second divided elements formed by dividing a second circular magneto-resistive element being concentric with and having a different radius from the first circular magneto-resistive element in the same manner as when dividing the first circular magneto-resistive element, and second linear elements parallel to the first linear elements, and a plurality of unit elements each comprising the first divided element, the second divided element, the first linear element and the second linear element are arranged at the intersection points.

8. The magnetic sensor device according to claim 7, wherein a first half-bridge circuit is formed by electrically connecting the plurality of first divided elements in series and electrically connecting the plurality of first linear elements in series, a second half-bridge circuit is formed by electrically connecting the plurality of second divided elements in series and electrically connecting the plurality of second linear elements in series, and a full-bridge circuit comprises the first half-bridge circuit and the second half-bridge circuit.

9. The magnetic sensor device according to claim 8, further comprising:
an op-amp that outputs an output signal obtained by differentially amplifying a first midpoint potential output from the first half-bridge circuit and a second midpoint potential output from the second half-bridge circuit; and
a controller that compares the output signal output from the op-amp with a threshold value and determines whether or not the magnet is proximate.

* * * * *